(12) United States Patent  
Kim

(10) Patent No.: US 6,735,359 B2  
(45) Date of Patent: May 11, 2004

(54) OPTICAL COMMUNICATION MODULE COMPRISING AN OPTICAL DEVICE WITH A CURVED OPTICAL WAVEGUIDE

(75) Inventor: Ho-In Kim, Yongin-shi (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/301,411

(22) Filed: Nov. 21, 2002

(65) Prior Publication Data

US 2003/0099440 A1 May 29, 2003

(30) Foreign Application Priority Data

Nov. 23, 2001 (KR) ................. 10-2001-0073263

(51) Int. Cl.[7] ................................. G02B 6/26
(52) U.S. Cl. ................. 385/31; 385/41; 385/45; 385/50
(58) Field of Search .................... 385/31, 45, 50, 385/14

(56) References Cited

U.S. PATENT DOCUMENTS 4,793,679 A * 12/1988 Toda et al. .................... 385/39  
6,542,670 B1 * 4/2003 Takahashi et al. ............. 385/45

* cited by examiner

*Primary Examiner*—John D. Lee  
*Assistant Examiner*—Eric Wong  
(74) *Attorney, Agent, or Firm*—Cha & Reiter, L.L.C.

(57) ABSTRACT

Disclosed is an optical communication module comprising: an active optical device includes a first optical waveguide through which light passes; and an optical waveguide device including a second optical waveguide, the second optical waveguide having an input end surface through which the light emitted from an output end of the first optical waveguide is incident to the second optical waveguide, wherein the output end of the first optical waveguide has a first unit vector which represents a direction in which light passing a predetermined first point on the output end proceeds.

8 Claims, 5 Drawing Sheets

US 6,735,359 B2

OPTICAL COMMUNICATION MODULE COMPRISING AN OPTICAL DEVICE WITH A CURVED OPTICAL WAVEGUIDE

CLAIM OF PRIORITY

This application claims priority to an application entitled "ACTIVE OPTICAL SEMICONDUCTOR HAVING A CURVED OPTICAL WAVEGUIDE," filed in the Korean Industrial Property Office on Nov. 23, 2001 and assigned Serial No. 2001-73263, the contents of which are hereby incorporated by reference.

BACKGROUND OF THE INVENTION

1. Field of the Invention

The present invention relates to an optical-communication module and, more particularly to an optical device having an optical waveguide mounted on an optical communication module.

2. Description of the Related Art

An optical-waveguide device comprises an optical waveguide through which light passes and a clad surrounding the optical waveguide to allow the light to pass only through the optical waveguide. Optical-waveguide devices may include optical semiconductors to which an optical waveguide and a clad are laminated on a semiconductor substrate.

A conventional optical communication module includes active optical devices and optical waveguide devices(or optical fibers). U.S. Pat. No. 6,273,620 issued to Kato, et al., entitled "SEMICONDUCTOR LIGHT EMITTING MODULE", discloses an example of an optical communication module, in which the light emitting module includes a semiconductor optical amplifier with a first optical waveguide and an optical fiber grating with a second optical waveguide to which a Bragg grating is printed.

In the conventional optical communication module, the alignment between an active optical device and an optical waveguide device, which may be a passive optical semiconductor, optical fiber, or another active optical semiconductor, plays a vital role because the misalignment between them causes coupling loss between the end surfaces of the active optical device and the optical waveguide device.

FIG. 1 is a schematic partial view of the active optical device and the optical waveguide device and, in particular shows the optical loss caused by the misalignment therebetween. As shown, the optical waveguide device 120 is aligned on an optical axis 130 and includes a second optical waveguide 122 forming a passage for the light to pass therethrough and a clad 124 surrounding the second optical waveguide 122. An active optical device 110 is aligned on the optical axis 130 and includes a first optical waveguide 112 which forms a passage for light to pass therethrough, a clad 114 surrounding the first optical waveguide 112, and upper and lower electrodes (not shown) which generate and amplify the light by means of injected carriers.

In addition, the optical waveguide device 120 and the active optical device 110 contain alignment lines 118 and 126, respectively, so that they can be used to align the devices 110 and 120. For example, when the optical waveguide device 120 and the active optical device 110 are mounted on a submount (not shown), the alignment lines 118 and 126 are aligned with auxiliary lines (not shown) that are marked on the submount to correspond to the alignment lines 118 and 126, such that the optical waveguide device 120 and the active optical device 110 can be aligned correctly. This type of alignment is known as a passive alignment method.

Another alignment is known as an active alignment method. In the active alignment method, for example, the optical waveguide device 120 is fixed, then the active optical device 110 is moved while the light output from the optical waveguide device 120 is monitored, so that the location of the active optical device 110 at which the light output has a maximum value can be found.

In comparison with the passive alignment method, it can be easily seen that the active alignment method as described above requires a more time during the manufacturing stage, thus not desirable to be used in mass-production.

Referring back to FIG. 1, the light generated in the active optical device 110 is discharged through one end surface of the active optical device 110, and the discharged light is introduced into the second optical waveguide 122 through the end surface of the optical waveguide device 120. In this case, the active optical device 110 and the optical waveguide device 120 are aligned on the optical axis 130 and the end surface of the optical waveguide device 120 is in parallel with the end surface of the active optical device 110, such that the light reflected by the end surface of the optical waveguide device 120 can transmit into the first optical waveguide 112. The light transmitting back into the first optical waveguide 112 serves as noise, thereby deteriorating the output characteristics of the active optical device 110.

FIG. 2 is a schematic partial view of an active optical device and an optical waveguide device, and it shows optical loss due to a size error of the active optical device when the active optical device and an optical waveguide device are packaged according to a passive alignment method. As shown, the first and second optical axes 230 and 250 are not in parallel to each other. The optical waveguide device 240 is aligned on the second optical axis 250, and the active optical device 210 is aligned on the first optical axis 230 using the alignment lines 218 and 246.

The optical waveguide device 240 is aligned on the second optical axis 250 by means of a second alignment line 246, and includes a second optical waveguide 242 forming a passage for the light to pass through and a clad 244 surrounding the second optical waveguide 242. The active optical device 210 is aligned on the first optical axis 230 by means of a first alignment line 218 and includes a first optical waveguide 212 forming a passage for light to pass through, a clad 214 surrounding the first optical waveguide 212, and upper and lower electrodes (not shown) which generate and amplify light by means of injected carriers. The first optical waveguide 212 is tilted with respect to an end surface 215 of the active optical device 210 such that the reflected light at the end surface 215 does not couple back into the first optical waveguide 212.

In operation, the light 260 generated in the active optical device 210 is emitted through the end surface 215 of the active optical device 210. In the case of the designed active optical device 220, light 270 (shown by a broken line) emitted from the designed active optical device 220 can be incident to the second optical waveguide 242. However, when the fabricated active optical device 210 shown by solid lines has a size different from that of the designed active optical device 220 shown by broken lines, the light 260 emitted from the first optical waveguide 212 is not incident to the second optical waveguide 242, thus its coupling efficiency is deteriorated. Note that the designed active optical device 220 represents the boundary where the proposed optical device 220 supposed to line up according to the design specification, whereas the fabricated active optical device 210 represents the actual product manufactured and positioned according to the design specification. The size difference between the designed active optical device 220 and the fabricated active optical device 210 is due to fabrication error, which occurs when cleaving a processed wafer into the designed bars. The size error due to this cleaving inaccuracy is around ±10 μm when working with InP or GaAs compound semiconductors. As a result, the light emitted from the end surface 215 of the active optical device 210 misses the second optical axis 250.

SUMMARY OF THE INVENTION

The present invention has been made to solve the above-mentioned problems occurring in the prior art and provides additional advantages, by providing an optical device that can prevent the deterioration of the optical coupling efficiency due to the size error in the optical device when the optical device and an optical waveguide device are packaged according to a passive alignment method.

Accordingly, there is provided an optical communication module comprising: an optical device including a first optical waveguide through which light passes; and, an optical waveguide device including a second optical waveguide, the second optical waveguide having an input end surface through which the light emitted from an output end of the first optical waveguide that is incident into the second optical waveguide, wherein the output end of the first optical waveguide includes a first unit vector which represents a direction in which light passing a predetermined first point on the output end proceeds, and the first unit vector forms a curve satisfying an equation, $n_1 \vec{L}_1 \times \vec{A} = n_2 \vec{L}_2 \times \vec{A}$, in which $n_1$, $\vec{L}_1$, $\vec{A}$, $n_2$, and $\vec{L}_2$ signify a refractive index of the first optical waveguide 312, the first unit vector, a normal vector of the first end surface, a refractive index of a medium in contact with the first end surface, and the second unit vector oriented toward the origin from the first point C.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENT

Hereinafter, the preferred embodiments of the present invention will be described with reference to the accompanying drawings. For the purposes of clarity and simplicity, a detailed description of known functions and configurations incorporated herein will be omitted as it may make the subject matter of the present invention unclear.

Figure 1:
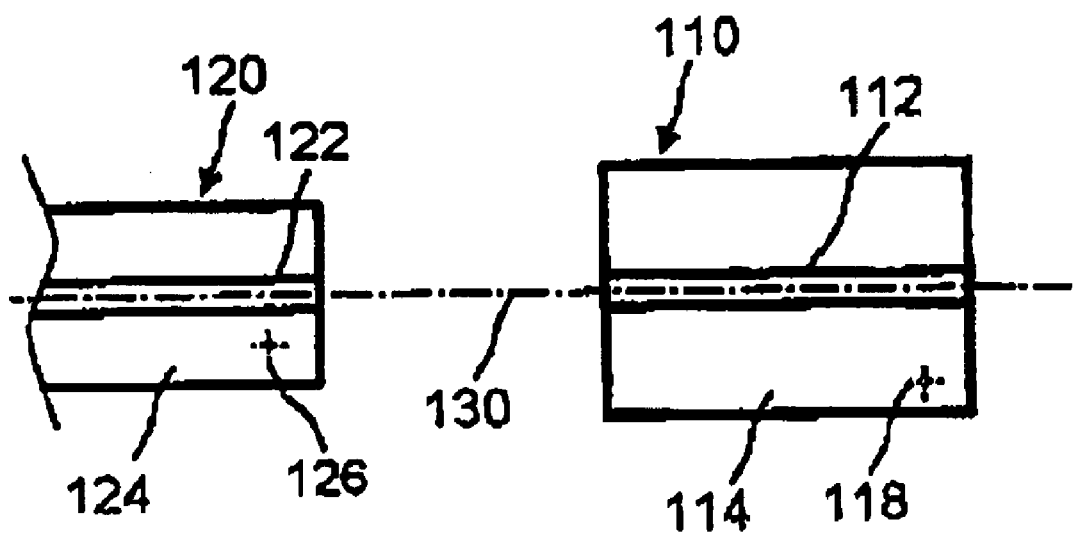
FIG. 1 is a schematic partial view of an active optical device and an optical waveguide device for describing optical loss due to the misalignment therebetween.
Figure 2:
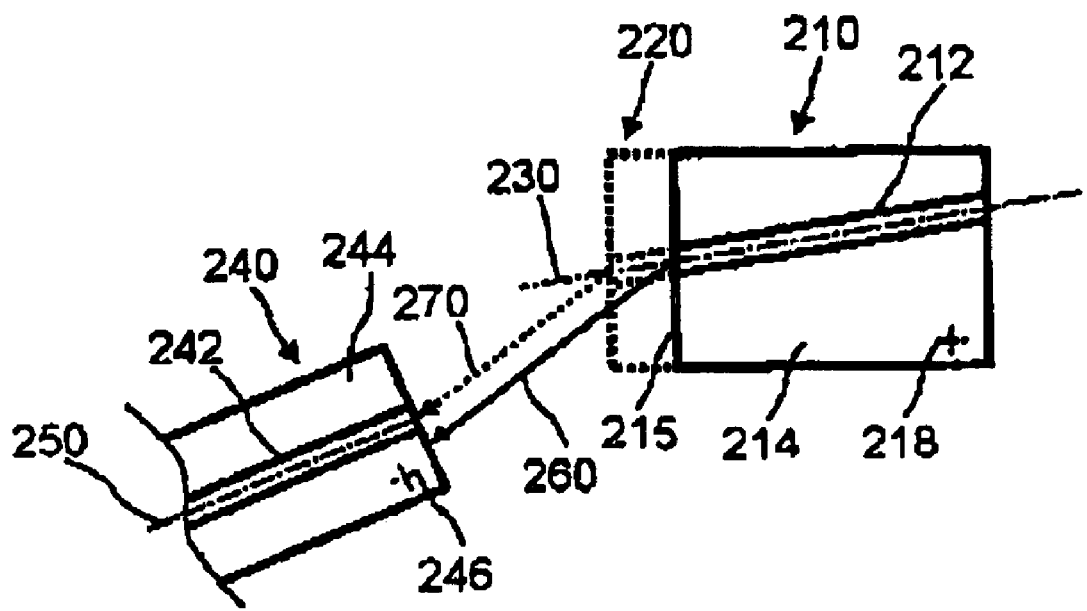
FIG. 2 is a schematic partial view of an active optical device and an optical waveguide device for describing optical loss due to the size error in the active optical device when the active optical device and an optical waveguide device are packaged according to a passive alignment method.
Figure 3:
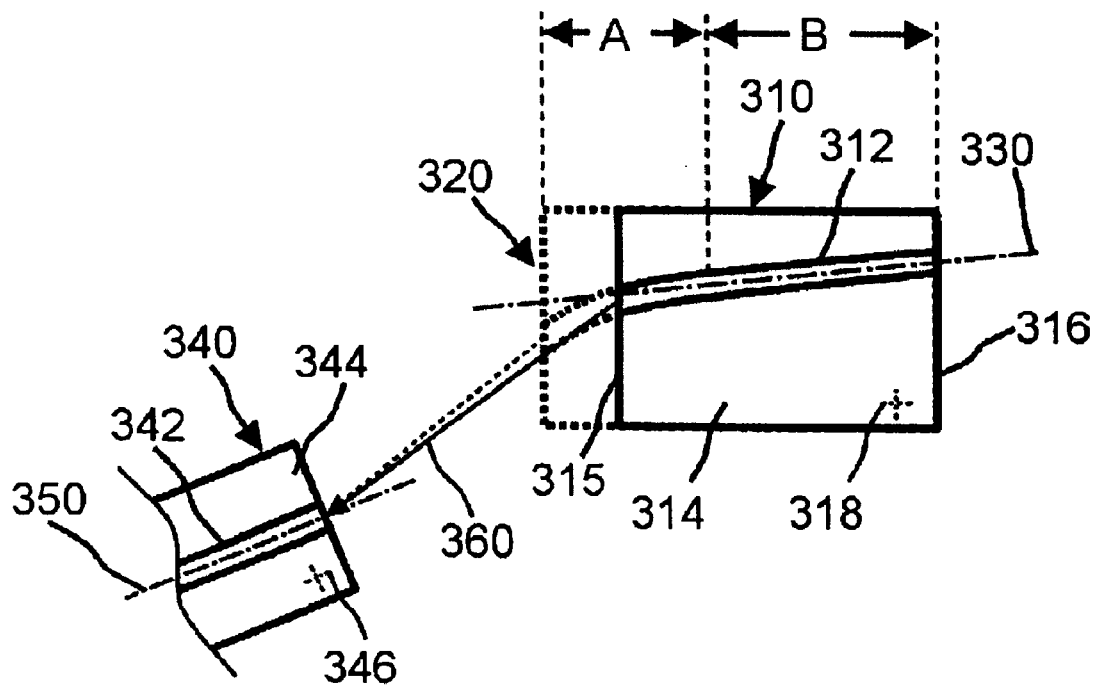
FIG. 3 is a schematic partial view of an active optical device according to a preferred embodiment of the present invention that is aligned with an optical waveguide device.

FIG. 3 is a schematic partial view of an optical device according to a preferred embodiment of the present invention which is aligned with an optical waveguide device. The optical device may be a InP or GaAs semiconductor device, or even a passive optical device for emitting light. An optical waveguide device 340 is aligned on the second optical axis 350 by means of a second alignment line 346, and an active optical device 310 is aligned on the first optical axis 330 by means of a first alignment line 318. As described earlier, these alignment lines are used to line up the devices against the corresponding reference lines(not shown).

In the embodiment, the optical waveguide device 340 having an end surface is aligned on the second optical axis 350, and it includes a second optical waveguide 342 forming a passage for the light to pass through and a clad 344 surrounding the second optical waveguide 342. The active optical device 310 having a first end surface 315 and a second end surface 316 is aligned on the first optical axis 330, and it includes a first optical waveguide 312 forming a passage for the light, a clad 314 surrounding the first optical waveguide 312, and upper and lower electrodes (not shown) which generate and amplify light by means of the injected carriers Thus, first and second optical axes 330 and 350 are not in parallel to each other. The first optical waveguide 312 is comprised of a curved end section A and a body section B. The curved end section A has a first end surface 315 through which light 360 is emitted. In case that the active optical device 310 is a InP or GaAs semiconductor device, the length of the curved section A is preferably within the range of 5 μm to 30 μm.

As shown in FIG. 3, the light 360 generated in the active optical device 310 is emitted through the first end surface 315 of the active optical device 310. Normally, as the active optical device 310 and the optical waveguide device 340 are positioned at an angle with respect to each other, the light reflected at the end surface of the optical waveguide device 340 is not incident back into the first optical waveguide 312. In particular, the first optical waveguide 312 is tilted with respect to a first end surface 315 of the active optical device 310 such that the reflected light at the first end surface 315 does not couple back into the first optical waveguide 312.

In operation, even when the fabricated active optical device 310 shown by the solid lines has a size different from that of a designed active optical device 320 shown by the broken lines, the light 360 (shown by a solid line) emitted from the first end surface 315 of the active optical device 310 is aligned with the second optical waveguide 342 of the optical wave guide 340 due to the curved section A configuration. Note that the designed active optical device 320 represents the boundary where the optical device 320 supposed aligned according to a design specification, and the fabricated active optical device 310 represents a product manufactured according to the design specification. The size or shift difference between the designed active optical device 320 and the fabricated active optical device 310 is due to fabrication error, which occurs when cleaving a processed wafer into bars having a designated length. The size error due to this cleaving inaccuracy is around ±10 μm when working with InP or GaAs compound semiconductors.

Figure 4:
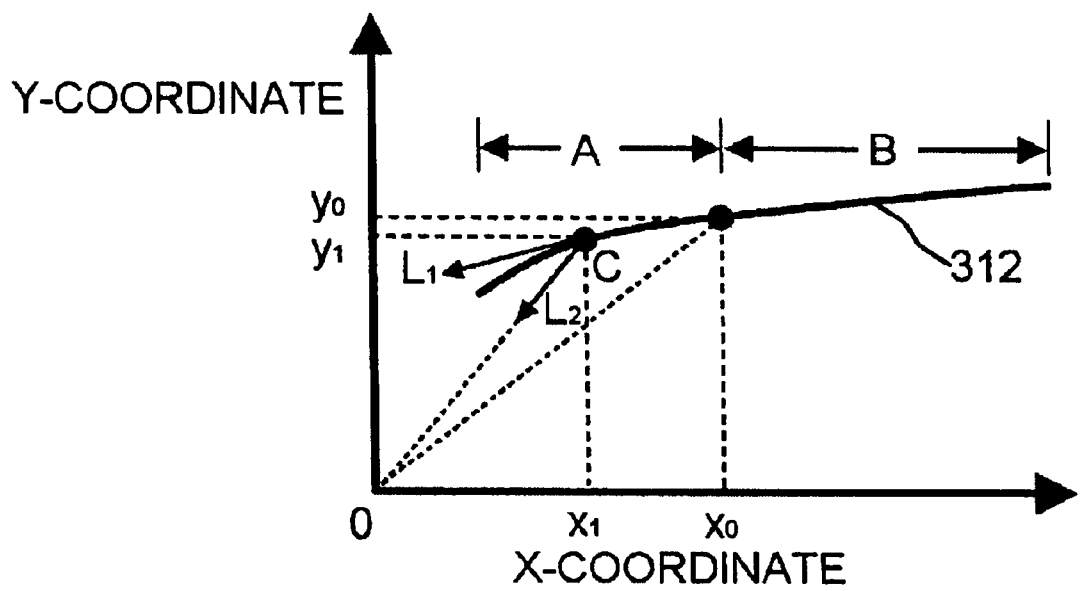
FIG. 4 is a graph showing the construction of the curved end section A of the first optical waveguide 312 shown in FIG. 3; and, FIG. 5 is a graph showing a curved end section according to an embodiment of the present invention.

FIG. 4 is a graph showing the construction of the curved end section A of the first optical waveguide 312 shown in FIG. 3. In order to facilitate the understanding, the first optical waveguide 312 is represented by a line which coincides with the axis of the first optical waveguide 312. As explained hereinafter mathematically, the light emitted from the first end surface 315 of the fabricated active optical device 310 can converge on the end surface of the second optical waveguide 342 as the first optical waveguide 312 includes a curved end section A.

Note that a tangent line passing through a first point C, which is a predetermined point on the curved end section A, is in parallel with a first unit vector $L_1$ representing a direction in which the light passing through the first point C proceeds. Further, the graph also shows a second unit vector $L_2$, which is oriented toward the origin of the graph from the first point C, and the origin corresponds to a point on which the light 360 shown in FIG. 3 converges. The first unit vector $L_1$ representing a direction in which the light passing a predetermined point on the curved end section A satisfies Equation 1, so that the first unit vector $L_1$ always can be oriented toward the origin.

Equation 1

$$n_1 \vec{L}_1 \times \vec{A} = n_2 \vec{L}_2 \times \vec{A}$$

In Equation 1, $n_1$, $\vec{L}_1$, $\vec{A}$, $n_2$, and $\vec{L}_2$ signify a refractive index of the first optical waveguide 312, the first unit vector $L_1$, a normal vector of the first end surface 315, a refractive index of a medium in contact with the first end surface 315, and the second unit vector $L_2$ oriented toward the origin from the first point C.

Equation 1 represents Snell's law, and the medium in contact with the first end surface 315 is mainly air and a refractive index is 1.

The curved end section A can be designed by repeatedly executing the following Equations 2 to 4 in sequence. In this case, $x_0$, $y_0$ (or $\theta_0$), $n_1$ and $n_2$ must be given as initial values.

Equation 2

$$x_{i+1} = x_i + C_{step}$$

In Equation 2, $C_{step}$ signifies a variance according to steps.

Equation 3

$$n_1 \times \sin(\theta_i) = n_2 \times \sin(\theta_{i+1})$$

Equation 4

$$y_{i+1} = x_{i+1} \times \tan(\theta_{i+1})$$

Figure 5:
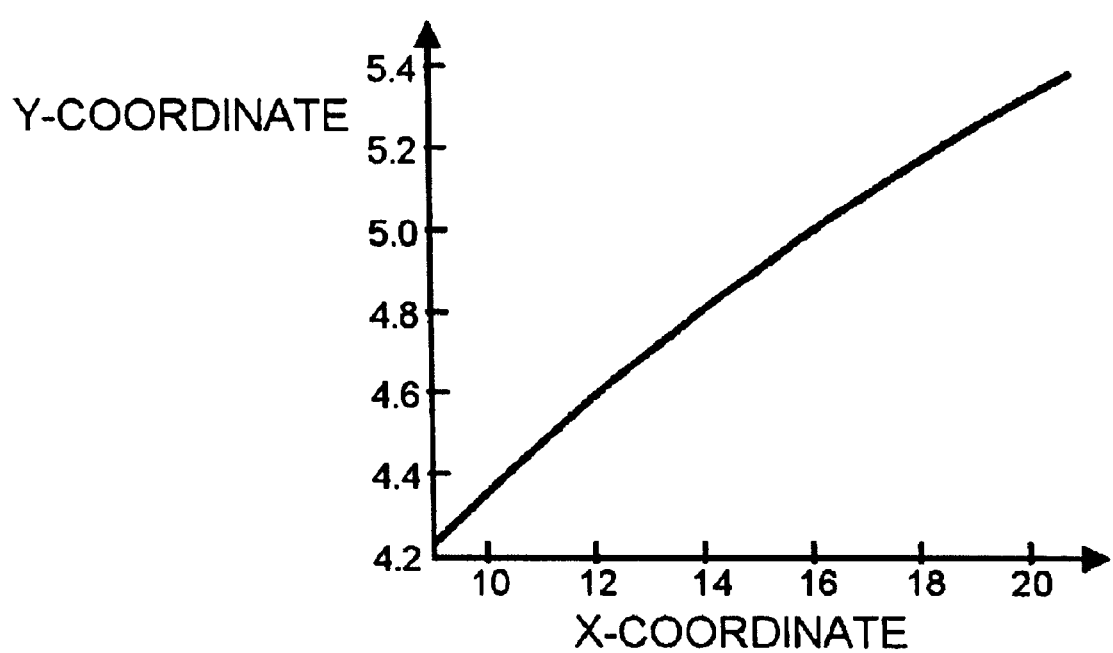

FIG. 5 is a graph showing a curved end section according to an embodiment of the present invention. The curve shown in FIG. 5 has coordinates satisfying the following Equation 6. The values of the variables used in Equation 5 are $x_0=10.0$, $y_0=4.35$, $n_1=3.27$ and $n_2=1.0$. The origin(x=0, y=0) is the point where the emitted light converges.

Equation 5

$$y = 2.35546 + 0.35368x - 0.02994x^2 + 0.00255x^3 - 1.71684E - 4x^4 + 8.54288E - 6x^5 - 3.01411E - 7x^6 + 7.11006E - 9x^7 - 1.00435E - 10x^8 + 6.42025E - 13x^9$$

As described above, in an optical device having a curved optical waveguide according to the present invention, an output end of the optical device is designed to meet a predetermined condition, thereby preventing the deterioration of optical coupling efficiency due to the size difference between the optical device and an optical waveguide device when they are packaged in a passive alignment in an optical communication module. The size error occurs when cleaving a processed wafer into bars of designated length. However, if the cleaved position lies in the curved section A, then the light emitted at the cleaved surface converge on the designated point that aligns with the optical axis 350 of the receiving optical element.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. An optical communication module comprising:
    an optical device having a first optical waveguide through which light passes, wherein the first optical waveguide has a curved end section at a first end surface of the optical device; and
    an optical waveguide device having a second optical waveguide, the second optical waveguide comprises a second end surface through which the light emitted from the first optical waveguide is incident to the second optical waveguide,
    wherein all the points of the curved end section is defined by a first unit vector satisfying the following equation, so that no matter where the curved end section is cleaved, the emitted light at the cleaved surface converge on an origin being the entrance point of the second optical waveguide:

$$n_1 \vec{L}_1 \times \vec{A} = n_2 \vec{L}_2 \times \vec{A}$$

wherein $n_1$ represents a refractive index of the first optical waveguide, $\vec{L}_1$, represents the first unit vector, $\vec{A}$ represents a normal vector of the first end surface, $n_2$, represents a refractive index of a medium in contact with the first end surface, and $\vec{L}_2$, represents a second unit vector oriented toward a predetermined point on the curved end point.

2. The optical communication module of claim 1, wherein the curved end section satisfies a predetermined condition.

3. The optical communication module of claim 1, wherein the optical device is a InP or GaAs semiconductor device, and the length of the curved end section is within the range of 5 μm to 30 μm.

4. The optical communication module of claim 1, wherein the optical device is aligned on a first optical axis by a first alignment means, and the optical waveguide device is aligned on a second optical axis by a second alignment means.

5. The optical communication module of claim 1, wherein the first and second optical axes are not in parallel to each other.

6. The optical communication module of claim 1, wherein the optical device comprising a first end surface and a second end surface is aligned on the first optical axis.

7. The optical communication module of claim 1, the optical device further comprises a clad surrounding the first optical waveguide.

8. The optical communication module of claim 1, wherein the optical device and the optical waveguide device are positioned at a predetermined angle with respect to each other, so that the light reflected at the end surface of the optical waveguide device is not coupled back into the first optical waveguide.

* * * * *